(12) United States Patent
Norman

(10) Patent No.: US 7,836,273 B1
(45) Date of Patent: Nov. 16, 2010

(54) FAST DATA ACCESS THROUGH PAGE MANIPULATION

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 0 days.

(21) Appl. No.: 12/804,630

(22) Filed: Jul. 26, 2010

Related U.S. Application Data

(62) Division of application No. 11/655,599, filed on Jan. 19, 2007, now Pat. No. 7,765,380.

(51) Int. Cl.
*G06F 9/34* (2006.01)
(52) U.S. Cl. .................. 711/201; 711/200; 711/219; 365/240
(58) Field of Classification Search .............. 711/200, 711/201, 219; 365/240
See application file for complete search history.

(56) References Cited

U.S. PATENT DOCUMENTS 4,084,195 A * 4/1978 Pereira ................. 358/470

* cited by examiner

*Primary Examiner*—Sanjiv Shah
*Assistant Examiner*—Jae U Yu

(57) ABSTRACT

A system and a method of accessing a memory are described. The system includes a memory, an interface configured to transfer data (e.g. a data packet), an aligner configured to receive the data and to generate aligned data, and a page buffer module configured to store the aligned data and, when the page buffer module is full with aligned data, transferring the aligned data to the memory. The method includes receiving data at an interface, aligning the data to generate aligned data, storing aligned data in a page buffer module configured to store aligned data for a write access and retrieved data from a read access, writing aligned data to a memory, and transferring retrieved data to the interface. Data can be transferred by the interface at a first rate and aligned data can be written to or retrieved from the memory at substantially the first rate.

18 Claims, 12 Drawing Sheets

| Sync 216 | EOF 214 | CRC 212 | Data Payload 210 | Address 208 | Rd/Wr 206 | Sync 204 | Align 202 |

| Sync 236 | EOF 234 | CRC 232 | Transfer Count 230 | Address 228 | Rd 226 | Sync 224 | Align 222 |

| Sync 254 | EOF 252 | CRC 250 | Data Payload 248 | Transfer Count 246 | Rd 244 | Sync 242 |

FAST DATA ACCESS THROUGH PAGE MANIPULATION

FIELD OF THE INVENTION

The present invention relates generally to semiconductors and memory technology. More specifically, fast data access is described.

BACKGROUND OF THE INVENTION

Memory technologies such as static random access memory (SRAM), dynamic random access memory (DRAM), and non-volatile memory systems are used for a variety of applications (e.g., software, hardware, operating systems, hard disk drives, storage systems, and the like). However, conventional SRAM, DRAM, and non-volatile memory technologies are problematic.

SRAM has low density storage capacity, fast access times for performing data operations (e.g., read, write, erase), and does not require frequent refreshing to maintain data in memory. However, SRAM is expensive to manufacture/fabricate and is volatile (i.e., requires a continuous power source in order to maintain data in memory). DRAM is less expensive to manufacture than SRAM, but is also volatile, requires a continuous power supply, and frequent refreshing in order to maintain data in memory. The development of non-volatile memory technology solved some of the problems associated with SRAM and DRAM memory technologies, but also resulted in other problems.

Non-volatile memory technologies are inexpensive to manufacture and does not require a constant power source or frequent refreshing. Without any moving mechanical components, non-volatile memory technologies also eliminate the possibility of mechanical failures that are common to hard disk drives that use mechanical motors, drive arms, servos, and read/write heads. However, conventional non-volatile memory technologies yield high storage densities and slower access speeds for performing data operations than either SRAM or DRAM. However, the cost-to-capacity (i.e., cost-to-density) ratio for non-volatile memory technologies is high and prevents wider adoption of this technology for main memory systems (i.e., those found in computers, PCs, servers, notebooks/laptops, and the like). As applications (e.g., software, hardware, circuitry-based programs that require storage capacity for operation) increase in complexity, storage needs are rising beyond the capabilities of existing SRAM, DRAM, and non-volatile memory technologies. Conventional memory technologies do not provide high density storage capacity, inexpensive manufacturing costs, non-volatility, and fast access times for performing data operations.

There are continuing efforts to improve high-density non-volatile memories.

BRIEF DESCRIPTION OF THE DRAWINGS

Various embodiments of the invention are disclosed in the following detailed description and the accompanying drawings.

Figure 1:
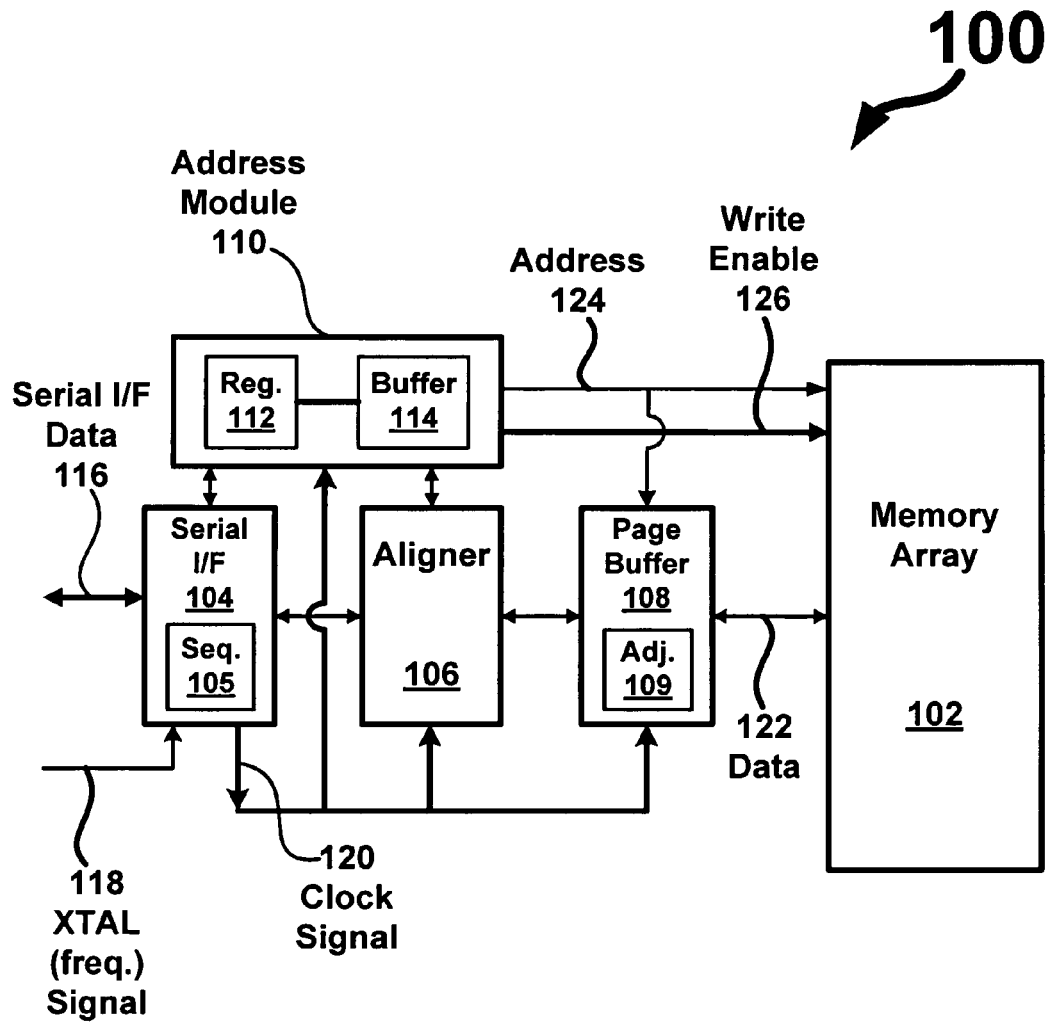
FIG. 1 illustrates an exemplary memory system configured to perform fast block access, in accordance with an embodiment.

Although the previous Drawings depict various examples of the invention, the invention is not limited by the depicted examples. Furthermore, the depictions are not necessarily to scale.

DETAILED DESCRIPTION

Various embodiments of the invention may be implemented in numerous ways, including as a system, a process, an apparatus, or a series of program instructions on a computer readable medium such as a computer readable storage medium or a computer network where the program instructions are communicated over optical, carrier wave, or electronic communication links, for example. In general, the steps of disclosed processes may be performed in an arbitrary order, unless otherwise provided in the claims.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Non-volatile memory technologies may be used with memory systems to develop high density, low cost, and fast access memories. Access may refer to accessing and performing data operations (e.g., read and write) on a memory array. Examples of memory arrays may include non-volatile third dimension memory.

U.S. patent application Ser. No. 11/095,026, filed Mar. 30, 2005, now U.S. Published Application No. 2006/0171200, and titled "Memory Using Mixed Valence Conductive Oxides," hereby incorporated by reference in its entirety and for all purposes, describes non-volatile third dimension memory cells that can be arranged in a cross-point array. The application describes a two terminal memory element that changes conductivity when exposed to an appropriate voltage drop across the two terminals. The memory element includes both a mixed ionic electronic conductor and a layer of material that has the bulk properties of an electrolytic tunnel barrier (properties of an electronic insulator and an ionic conductor). A voltage drop across the electrolytic tunnel barrier causes an electrical field within the mixed ionic electronic conductor that is strong enough to move oxygen ions out of the mixed ionic electronic conductor and into the electrolytic tunnel barrier. Oxygen depletion causes the mixed ionic electronic conductor to change its conductivity. Both the electrolytic tunnel barrier and the mixed ionic electronic conductor do not need to operate in a silicon substrate, and, therefore, can be fabricated above circuitry being used for other purposes (e.g., selection circuitry, sense amps, and address decoders). A memory is "third dimension memory" when it is fabricated above other circuitry components, the components usually including a silicon substrate, polysilicon layers and, typically, metallization layers.

The two-terminal memory elements can be arranged in a cross-point array such that one terminal is electrically coupled with an x-direction line and the other terminal is electrically coupled with a y-direction line. A stacked cross-point array consists of multiple cross-point arrays stacked upon one another, sometimes sharing x-direction and y-direction lines between layers, and sometimes having isolated lines. When a first write voltage $V_{W1}$ is applied across the memory element, (typically by applying ½ $V_{W1}$ to the x-direction line and ½-$V_{W1}$ to the y-direction line) it switches to a low resistive state. When a second write voltage $V_{W2}$ is applied across the memory element, (typically by applying ½ $V_{W2}$ to the x-direction line and ½-$V_{W2}$ to the y-direction line) it switches to a high resistive state. Typically, memory elements using electrolytic tunnel barriers and mixed ionic electronic conductors require $V_{W1}$ to be opposite in polarity from $V_{W2}$.

Fast accesses for data operations may be achieved by using page buffers to allow multiple data operations to be performed substantially simultaneously (i.e., buffering data from a read and a write access). Further, various embodiments of data packet formats and data communication protocols may be used to indicate how data from different data operations (e.g., read, write, erase) may be aligned to allow fast accesses to a memory array.

FIG. 1 illustrates an exemplary memory system configured to perform fast block accesses, in accordance with an embodiment. In some embodiments, system 100 includes memory array 102, serial interface (I/F) 104, state sequencer 105, aligner 106, page buffer module 108 (which may be implemented using dual page buffers), page adjuster 109, and address module 110, which includes address register 112 and address buffer 114. In other embodiments, address module 110 may include fewer or more registers, counters, and buffers, and is not limited to those described. Data may be transferred across, through, or over a data path that may include: serial I/F data 116, crystal oscillator (XTAL) frequency signal 118, clock signal 120, data path 122, address data path 124, and write enable signal path 126. In some examples, serial I/F data 116 may be implemented using a serial, multiple serial, parallel, or other interface and is not limited to the interface described. Accordingly, serial I/F 104 can be configured to operate on serial, multiple serial, parallel, or other data and signals.

Data and signals specifying various types of data may be input to system 100. Here, serial I/F data 116 is received from an external source (e.g., host, system, and the like) and sent to serial I/F 104. XTAL signal 118 is also input to serial I/F 104, which provides a stable reference signal from which clock signal 120 may be generated. XTAL signal 118 and clock signal 120 may be used to provide a stable reference signal for the operation of system 100, particularly when aligning data packets received at serial I/F 104, which is described in greater detail below.

In some embodiments, serial I/F 104 may be implemented using a parallel interface, high speed serial interface (HSSI), or other serial interface. In other embodiments, an interface configured to support data transfer rates operating at high frequencies (e.g., Giga Hertz and above) may be used. In still other embodiments, high speed applications may be implemented using multiple serial data input/output lines ("ports") in parallel in order to divide processing tasks and decrease data transfer times. In the following description, serial I/F data 116 will be assumed to be transmitted over multiple ports. Data packets received by serial I/F 104 may be processed and handled using address module 110, aligner 106, and address buffer 114 to perform read and write accesses at speeds (i.e., a data transfer rate) matching the data transfer rate of serial I/F 104. Examples of data packet formats and handling techniques are described in greater detail below in connection with FIGS. 2A through 2C.

Referring back to FIG. 1, address module 110 includes address register 112 and address buffer 114. In other embodiments, one or more address registers, counters, and address buffers may be implemented in addition to address register 112 and address buffer 114. Address module 110 process bits in a data packet that is part of a data stream or a block of data to be written to or read from system 100. Data bits may indicate address 124, which identifies locations within memory array 102 where data is to be read or written. If a write access is to be performed, then write enable 126 (i.e., a signal or command sent to enable a write access to a particular location) is sent from address module 110 to memory array 102. In some embodiments, address module 110 allows data payloads (i.e., data to be written to or read from memory array 102) to be processed using page buffer module 108, which allows for data handling at speeds that are equivalent or near-equivalent to the data transfer rates of serial I/F 104 or other interfaces that may be used in different embodiments. Here, system 100 uses page buffer module 108 to allow wide (e.g., large blocks or groups of data packets) parallel reads and writes because multiple page buffers are used to store and transfer data synchronously (i.e., in an offset manner such that a read or write access is being continuously performed and a contiguous data stream is being transferred to memory 102) at data transfer rates matching serial I/F 104. Page buffer module 108 offsets the read and write access of data packets to locations in memory array 102 (as determined by address module 110) extracted from a page block (e.g., a memory block) in memory array 102. Page adjuster 109 offsets read and write access in memory array 102, which results in fast accesses in memory array 102 at speeds substantially similar to those of accessing RAM (e.g., SRAM, DRAM). System 100 enables fast access of memory array 102, which may perform data operations (e.g., read or write accesses) at speeds equivalent or near-equivalent to the access speeds of RAM implementations (e.g., SRAM, DRAM). Write accesses to the array 102 may include program and erase operations.

In some embodiments, serial I/F 104 may be implemented to handle data communication at various layers (e.g., physical layer (PHY), transport layer, and other layers such as those found in the Open Systems Interconnection (OSI) or Internet application layer models) by using encoding and decoding logic, which may be implemented as hardware, software, circuitry, or a combination thereof in serial I/F 104 or external to serial I/F 104. For data handling, packet formats may use primitives that are detected by an encoder/decoder (not shown) in serial I/F 104. Further, serial I/F 104 may be implemented according to data communication standards, such as those established by the Institute of Electrical and Electronic Engineers (IEEE), or others. In other embodiments, serial I/F 104 may be implemented using a proprietary standard. By using a data communication protocol (e.g., standard or proprietary), a handshake protocol may also be implemented, which enables system 100 to establish a data communication link with another host, machine, system, and the like in order to enable the transmission, receipt, interpretation, and handling of data packets, for example. Different data communication protocols may also be used to support different types of network technologies, including but not limited to Ethernet, Fibre Channel, and others. The features and components of system 100 may be implemented using numerous variations and are not limited to the above descriptions.

Figure 2A:
FIG. 2A illustrates an exemplary packet format for writing data to memory using fast block access, in accordance with an embodiment.

FIG. 2A illustrates an exemplary packet format for writing data to memory using fast block access, in accordance with an embodiment. Here, packet 200 may be implemented as a packet format for a data communication protocol that enables fast access to a page block (i.e., a block of memory in memory array 102 (FIG. 1)) by manipulating, aligning, or adjusting data received through an interface such as those described above. In some embodiments, manipulating may be used to describe aligning or adjusting data, as described herein. Packet 200 has several primitives and fields that may include, when read from right to left (i.e., the order in which a decoder within serial I/F 104 decodes the packet 200 and its associated fields), one or more bits that guide the handling of data included in the packet 200. In some embodiments, packet 200 includes align field 202, synchronization (sync) character 204, read/write (Rd/Wr) field 206, address field 208, data payload 210, cyclic redundancy check (CRC) field 212, end of frame (EOF) field 214, and synchronization (sync) character 216. Here, packet 200 may be used to perform write access by including a write primitive in read/write field 206. The above-mentioned fields may include one or more bits (e.g., "0" or "1") that constitute a primitive indicating a feature, operation, or handling characteristic for packet 200.

Here, data to be written to a memory array (e.g., memory array 102 (FIG. 1)) may be communicated using packet 200 as a data packet format. In some embodiments, packet 200 includes fields that determine how handling and transfer occur. As an example, align field 202 provides address bits that may be used to determine alignment of data. As another example, align field 202 may include a primitive (i.e., bit, or set of bits) that indicates how packet 200 is aligned relative to the bits in a data stream for performing an access to write data to memory. Align field 202 may be detected at serial I/F 104 (FIG. 1), which processes packet 200 such that bit alignment is maintained, which enables a continuous flow of packets to page buffer module 108 at speeds substantially similar to those of serial I/F 104. Sync characters 204 and 216 may be used to indicate serial I/F 104 is in an idle state during which no activity occurs. Read/write field 206 includes primitives (i.e., bit or set of bits) that indicate the start of an access and the type of access. Address field 208 indicates the location (i.e., starting memory address) of an access within a memory array (e.g., memory array 102 (FIG. 1)). CRC field 212 provides a bit or set of bits that may be used to determine whether an error has occurred during data transfer, in which case packet 200 may be either disregarded or requested again. In some embodiments, error correction code may be used in place of CRC field 212, which provides the ability to correct an error that occurs during data transfer. EOF field 214 provides a primitive that indicate the end of a data transfer written or read to a particular address or block of addresses in a memory array (e.g., memory array 102 in FIG. 1). Sync character 216, as mentioned above, may be used to indicate when serial I/F 104 is in an idle state during which data transfer for the next sequential or serial packet may occur.

In some embodiments, data packets are transferred across or over serial I/F 104, which detects read/write field 206. When read/write field 206 is detected, state sequencer 105 begins orchestrating the handling of packet 200. Address field 208 is detected by address module 110, which identifies the location of the access and, if a write primitive is received, a write enable (e.g., write enable 126 (FIG. 1)) is sent to memory array 102 for the indicated address. In some examples, an access begins when the least significant bits (LSB) of address field 208 are decoded and loaded into address registers 112 included in address module 110. The LSB indicated in address field 208 are also used by aligner 106 to adjust where data payload 210 is "loaded" (i.e., saved to word registers within page buffer module 108) before being transferred to memory array 102 at the address indicated by address field 208. After data in packet 200 for the first word is loaded into page buffer module 108, subsequent bytes are sequentially loaded and sent to memory array 102 in a similar manner. When aligner 106 aligns the first word (i.e., data payload 210), write enable 126 is sent to memory array 102. In some embodiments, a signal indicating a write enable may include control parameters that guide the handling and transfer of aligned data for a read or write access. After the first word in a data stream (i.e., the first packet received using the format described by packet 200) is transferred to memory array 102, subsequent write enables may be performed. Data is transferred to memory array 102 until an EOF primitive in EOF field 214 is detected. In some embodiments, an EOF primitive may not be included in each packet. In other embodiments, an EOF primitive may be included in the last packet of a data stream for a read or write access that is accessing a given address. After EOF field 214 is detected, bits in CRC field 212 may be applied to a calculated value of data written to memory array 102 to check for errors that may have occurred during data transfer over serial I/F 104. In some embodiments, an error correction code bit or field (not shown) may be used instead of CRC field 212 for error correction. In some embodiments, the packet 200 may include a transfer count field (not shown) for indicating the amount of data transferred from memory array 102 to a requesting host during a read access. In some embodiments, when the read/write (Rd/Wr) field 206 indicates a read operation is commanded for a read access from memory 102, one or more of the fields in the packet 200 may be ignored, such as the data payload 210, for example.

Figure 2B:
FIG. 2B illustrates an exemplary packet format sent from a host to a memory requesting a read using fast block access, in accordance with an embodiment.

FIG. 2B illustrates an exemplary packet format sent from a host to a memory requesting a read using fast block access, in accordance with an embodiment. Here, packet 220 includes align field 222, sync character 224, read field (Rd) 226, address field 228, transfer count 230, CRC field 232, EOF field 234, and sync character 236. In some embodiments, packet 220 is a format used for data packets sent to a memory (e.g., memory array 102) requesting a read access of a memory cell, block, or array. When packet 220 is received by serial I/F 104 (and also read from right to left, as described above for packet 200 in FIG. 2A), read field 226 is detected, which indicates data is to be accessed and read from memory array 102. Data included in the payload of a packet (e.g., packet 240 as described below in connection with FIG. 2C) is aligned according to address field 228, which is read and adjusted through page buffer module 108 and page adjuster 109 (FIG. 1). When a buffer within page buffer module 108 is filled or made unavailable, data held in page buffer module 108 is transferred to serial I/F 104 and, subsequently, to a destination host (not shown). Serial I/F 104 sends a read primitive in read field 226, which indicates the start of a read data transfer to the requesting host. Transfer count 230 indicates the amount of data transferred from memory array 102 to a requesting host. Data bits representing a CRC character and end of file (EOF) primitive may be included in CRC field 232 and EOF field 234, respectively.

Figure 2C:
FIG. 2C illustrates an exemplary response packet format for reading data from memory using fast block access, in accordance with an embodiment.

FIG. 2C illustrates an exemplary response packet format for reading data from memory using fast block access, in accordance with an embodiment. Here, packet 240 includes sync character 242, read field 244, transfer count 246, data payload 248, CRC field 250, EOF field 252, and sync character 254. In some embodiments, packet 240 is a format used for data packets generated by a memory and sent to a host in response to a request for a read access of a memory cell, block, or array. Packet 240 and its associated header data, fields, and payload, are read from right to left by a decoder that may be implemented within serial I/F 104 (FIG. 1). As described above, sync characters 242 and 254 may be used to indicate when serial I/F 104 is in an idle state. Read field 244 may include a primitive that, when detected, indicates a read access is being performed. Transfer count 246 indicates how much data is to be transferred in data payload 248, which may be checked for errors using CRC field 250. EOF field 252 may include a primitive that indicates, when detected, the end of data payload 248 transferred by a given packet or the end of a given data stream. In some embodiments, packet 240 may include an address field (not shown) which indicates the starting address of the data packet being generated by the memory. In other embodiments, the various fields, characters, and primitives may be varied and are not limited to the descriptions provided above in connection with FIGS. 2A through 2C.

Figure 3A:
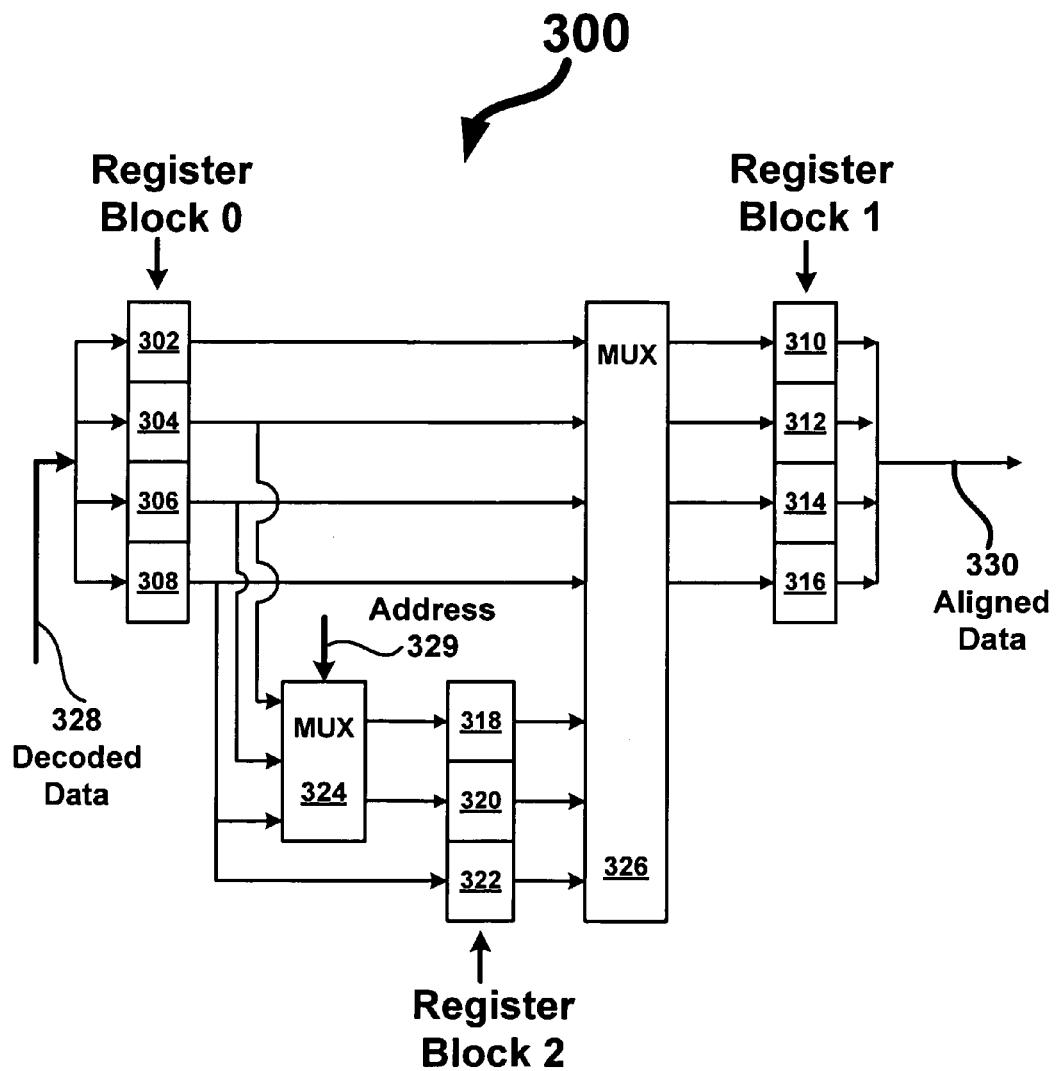
FIG. 3A illustrates an exemplary aligner, in accordance with an embodiment.

FIG. 3A illustrates an exemplary aligner, in accordance with an embodiment. An aligner 300 includes registers 302-322 and multiplexers (MUX) 324 and 326. In some embodiments, aligner 300 may be implemented as software, hardware, circuitry, or a combination thereof. Here, a register block 0 (including registers 302-308) is 4 bytes in width, a register block 1 (including registers 310-316) is 4 bytes in width, and a register block 2 (including registers 318-322) is 3 bytes in width. Registers 302-322 are each configured to handle one byte, but in other embodiments, longer or shorter words may be supported with differently sized registers. Furthermore, more or fewer registers for each of the register blocks 0-2 may be used. In this embodiment, decoded data 328 is loaded into register block 0 (registers 302-308) after being received and decoded at serial I/F 104 (FIG. 1). After being loaded into register block 0 (registers 302-308), decoded data from registers 302-308 is transferred to MUX 326. MUX 326 then shifts the decoded data as necessary, such that the data from register 302 is mapped into either register 310 (no shift occurring), register 312 (data being shifted by one byte) register 314 (data being shifted by two bytes) or register 316 (data being shifted by three bytes). If the address indicates no shift, then registers 304-308 are mapped directly to registers 312-316. If the address indicates a starting address that indicates data needs to be shifted by one byte, then data from registers 304 and 306 are mapped onto registers 314 and 316. Data from register 308 is stored in register 318 of register block 2 for one cycle so that it can be mapped to register 310 in the following cycle. For the initial writing cycle during a single byte-shift, either register 310 is not active so that no data is written to the location of memory array 102 (FIG. 1) corresponding to register 310 (utilizing a write enable, as described elsewhere), or the existing data in the corresponding address is read into register 310, so that the data is unchanged after registers 310-316 are written to memory array 102 (FIG. 1).

MUX 324 is optionally used to remove some of the logic requirements of MUX 326, allowing register 318 to always be mapped to register 310, register 320 to be mapped to register 312 and register 322 to be mapped to register 314. Accordingly, if the starting address indicates a shift of two bytes, then data that originally goes into registers 302 and 304 are mapped to registers 314 and 316, while data from registers 306 and 308 are stored for one cycle in registers 318 and 320 and then mapped to registers 310 and 312 in the following cycle. As more data is received by serial I/F 104 (FIG. 1), the newly decoded data from registers 302 and 304 continue to be mapped to registers 314 and 316, while new data from registers 306 and 308 are stored for one cycle in registers 318 and 320 and data from the previous cycle is mapped to registers 310 and 312.

In some embodiments, aligner 300 may be implemented for aligner 106 (FIG. 1). Aligner 300 shifts data bytes (e.g., 1, 2 or 3 bytes) to yield an offset for reading or writing data into a page buffer. By aligning data, aligner 300 ensures that a continuous, sequential data flow may be maintained. Aligner 300 shifts data similarly for read and write accesses. In some embodiments, aligner 300 may be duplicated in order to support operations for multiple accesses. In other embodiments, if read and write accesses do not overlap, a multiplexer (e.g., MUX 606, see below in connection with FIG. 6A) may be used to support both types of accesses. MUX 326 transfers aligned (i.e., shifted) data to register block 1 (registers 310-316), which are used as inputs for transferring aligned data 330 to page buffers (e.g., page buffer module 108 in FIG. 1).

Figure 3B:
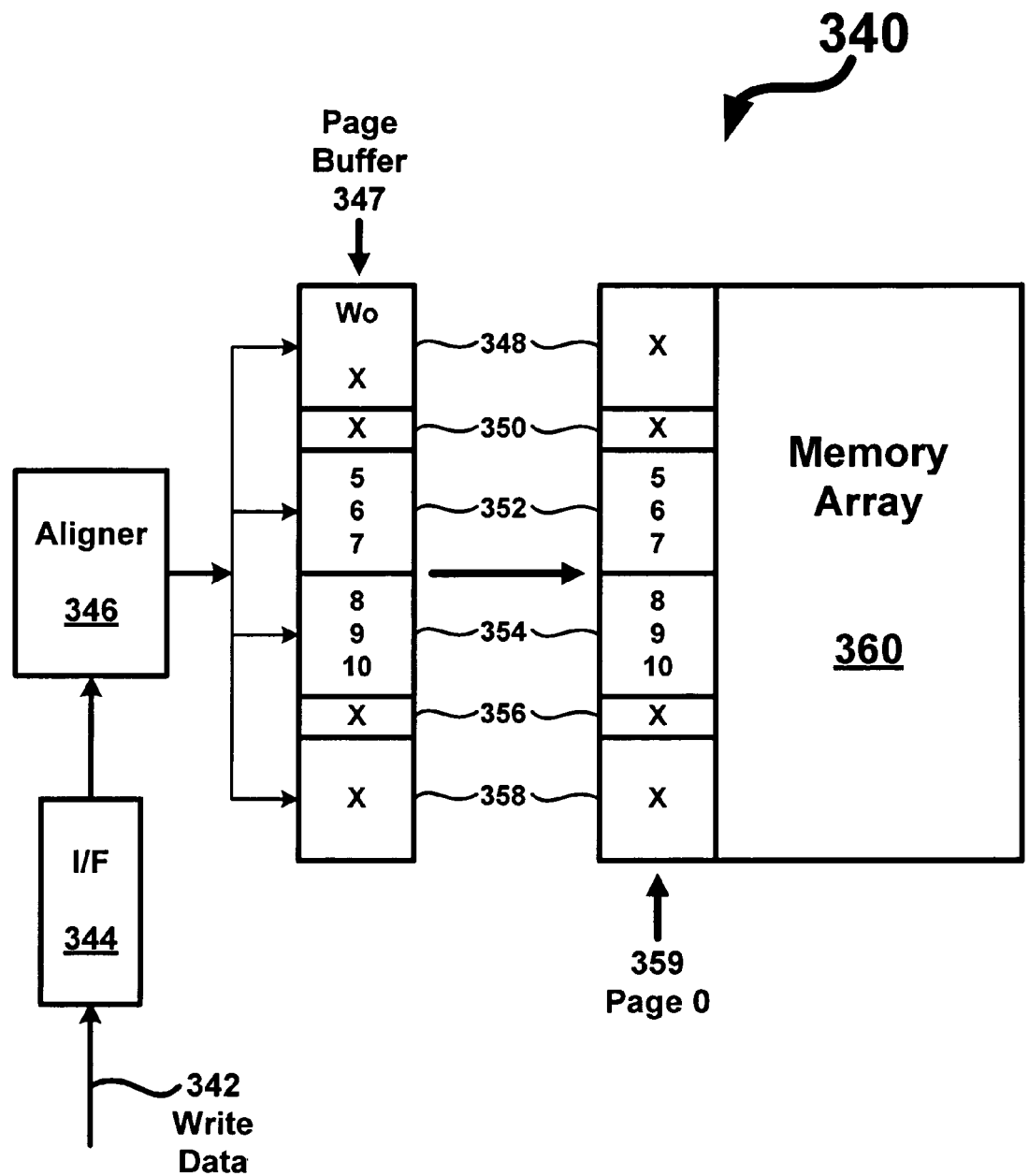
FIG. 3B illustrates an exemplary aligner in a write path, in accordance with an embodiment.

FIG. 3B illustrates an exemplary aligner in a write path, in accordance with an embodiment. Here, system 340 includes write data 342 received at interface I/F 344, which may be implemented as a serial, parallel, or other type of interface. Also included is aligner 346, which receives write data 342 from interface I/F 344 and aligns the data to be stored, in this embodiment, a 4-word data stream in page buffer 347. In some embodiments, aligner 346 shifts data bits to align data bits in a data stream in order to write data to memory array 360 at an indicated address. Page buffer 347 transfers data (i.e., writes data indicated by "5 6 7 8 9 10") to fields 348-358. Fields 348-358 may be implemented using logic registers, which are separate from memory array 360. When page buffer 347 is filled or an end of frame (EOF) bit or primitive is detected, the data stored in page buffer 347 is written to "Page 0" 359 of memory array 360. In this example, the data is stored in a memory cell of memory array 360 that may be referenced by an address stored in fields within register 112 of address module 110 (FIG. 1). Bytes included in a page of data to be written to a memory use the same memory address. Words are byte aligned and loaded into page buffer 347 for each word address.

Figure 3C:
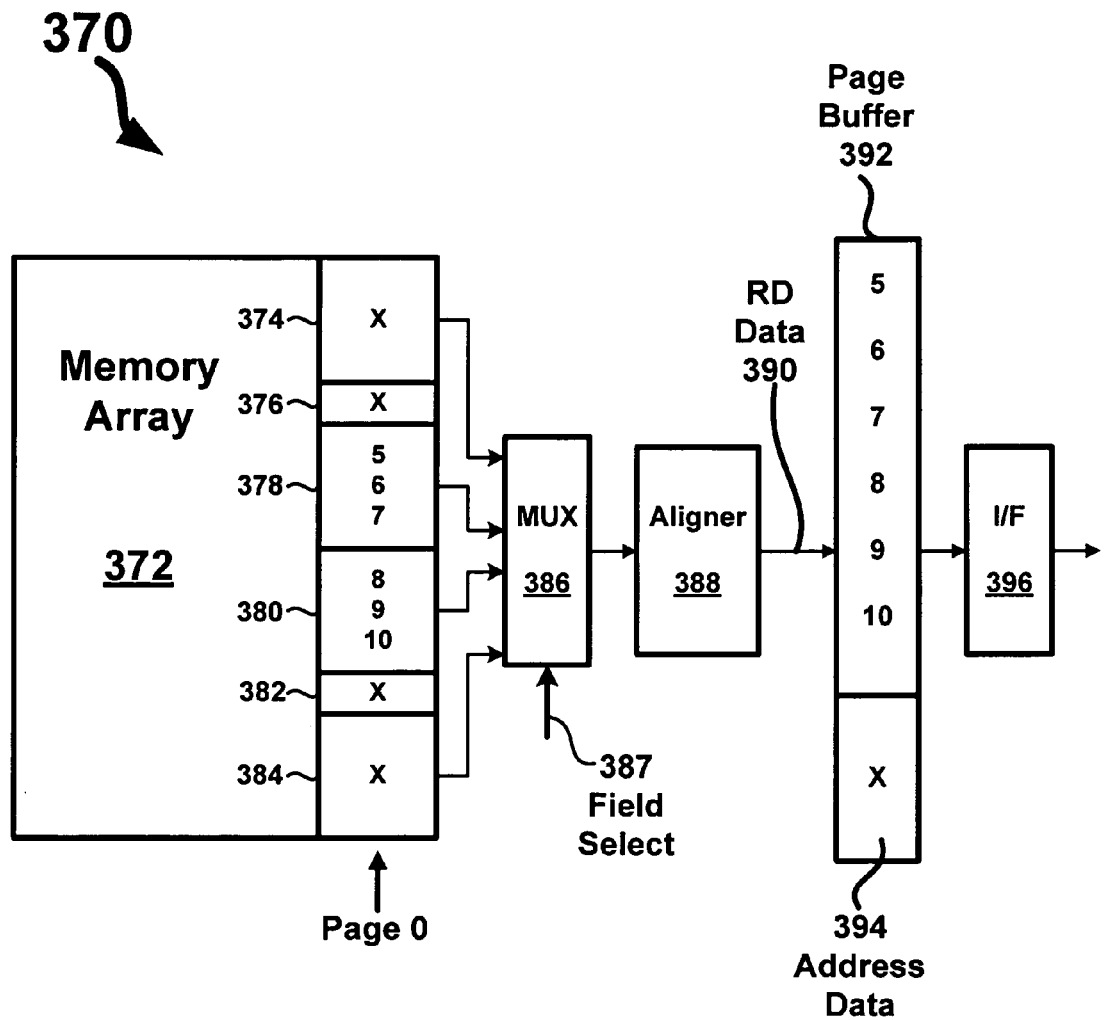
FIG. 3C illustrates an exemplary aligner in a read path, in accordance with an embodiment.

FIG. 3C illustrates an exemplary aligner in a read path, in accordance with an embodiment. Here, system 370 includes memory array 372, which includes data stored in fields 374-384. As in the embodiment described above in connection with FIG. 3B, a 4-word data block (i.e., data read from array 372) may be stored in fields 374-384, from which data is then transferred to multiplexer (MUX) 386. MUX 386 passes data read from fields 374-384 to aligner 388, which aligns the data bits of the data stream being read from memory array 372 for storage in page buffer 392. The read (RD) data 390, which may include address data 394, is passed to interface I/F 396 and transferred to the requesting host, memory, client, or the like. In some embodiments, the function of aligner 388 is to byte align the first word read from memory array 372. In other words, the first bit or byte requested is the first word stored in page buffer 392. Subsequently the first bit or byte stored in page buffer 392 is the first word transferred over interface I/F 396 (e.g., byte "5" stored in field 378).

Figure 4:
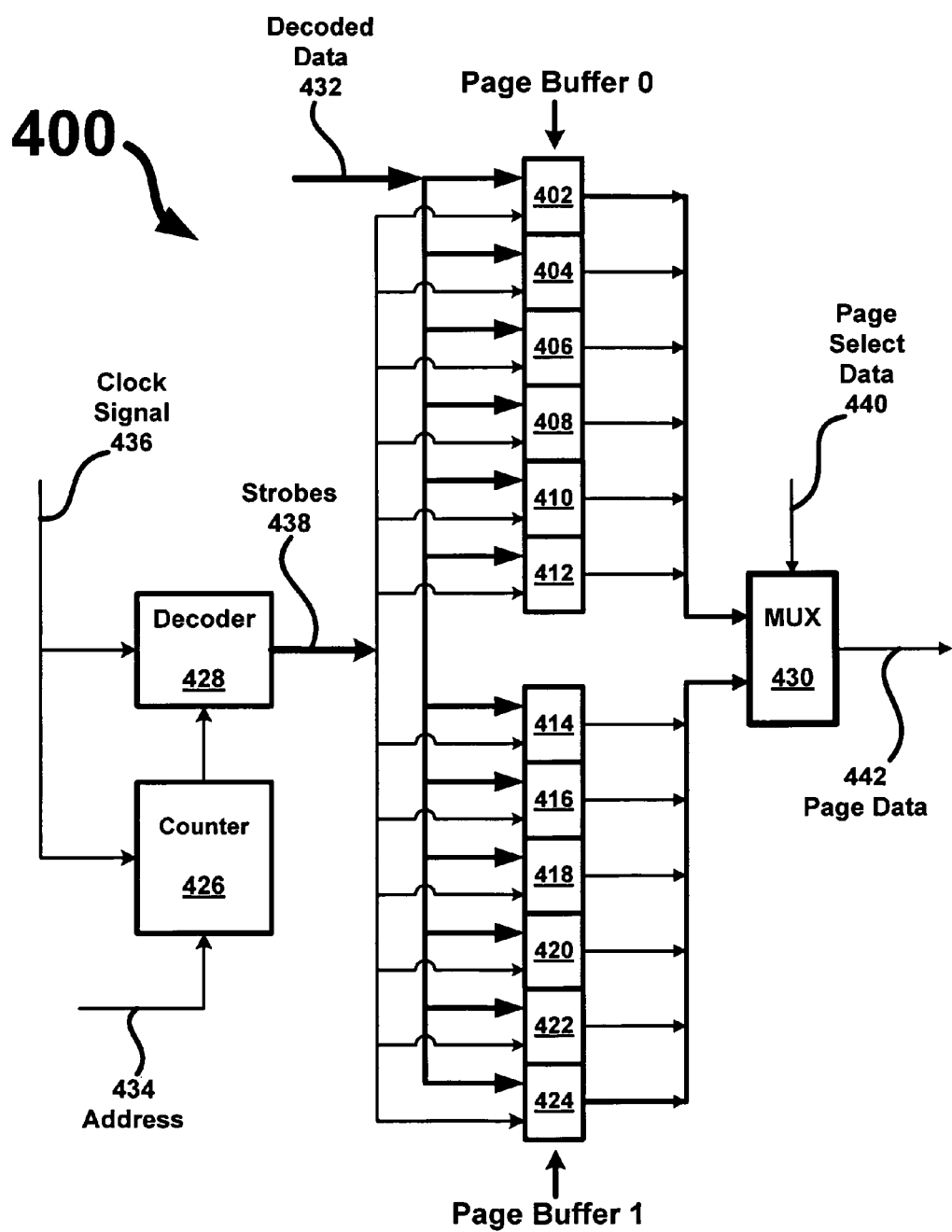
FIG. 4 illustrates an exemplary dual page buffer system, in accordance with an embodiment.

FIG. 4 illustrates an exemplary dual page buffer system, in accordance with an embodiment. Here, dual page buffer system 400 includes word registers 402-424, counter 426, decoder 428, and multiplexer (MUX) 430. Decoded data 432 is received into page buffer 0 (word registers 402-412) and page buffer 1 (word registers 414-424). As decoded data 432 (which is also aligned) is received, decoded data 432 is loaded (i.e., stored) into page buffer 0 (word registers 402-412). As the word registers are loaded, when a page buffer is filled, the data is written to memory or transferred to an interface for a read access. MUX 430 receives data from the word registers in page buffers 0 or 1 and combines or multiplexes the data for further transfer. Using page select data 440 to select data from page buffer 0 or from page buffer 1, MUX 430 outputs the selected page data 442 to memory (e.g., memory array 102 in FIG. 1) for a write access.

As an example, when word registers 402-412 in page buffer 0 are filled, the data included in page buffer 0 is selected by MUX 430. Using page select data 440 to identify a particular block (i.e., page block) of memory array 102 (FIG. 1), MUX 430 transfers the data from page buffer 0 as page data 442 to memory array 102. As page data 442 is written to memory 102 from page buffer 0, page buffer 1 is filled, providing "overlapping" handling of decoded data 432 from aligner 106 (FIG. 1). When the transfer of page data 442 from page buffer 0 is complete and when word registers 414-424 in page buffer 1 are filled, MUX 430 switches to page buffer 1 and, using page select data 440, transfers page data 442 to memory array 102. Page data 442 transferred from page buffers 0 and 1 may be written to sequential memory locations. In either example, data transfer is continuous and supported at speeds substantially similar to those of serial I/F 104 (FIG. 1). Again, as page data 442 is transferred by MUX 430 from page buffer 1, word registers 402-412 of page buffer 0 are filled. This sequence continues until a complete set of data for a given data stream, page block, or address is stored. In some embodiments, the time period to perform a write access may be varied to match the fill time for word registers 402-424, which enables operation at speeds that are equivalent or near-equivalent to interface (e.g., HSSI, serial I/F 104, parallel, parallel serial, and the like) speeds. Likewise, read accesses may be performed to achieve equivalent or near-equivalent interface speeds by alternating between reading and transferring data from memory array 102 to word registers 402-424 in page buffers 0 and 1. In other embodiments, the number of word registers may be varied in each page buffer in order to support a number of bits that allows operation at interface speeds.

In some embodiments, word registers 402-424 in page buffers 0 and 1 may be sequentially loaded. The sequence for loading decoded data 432 is performed by loading an address 434 for decoded data 432 into counter 426. Using clock signal 436 as a stable reference signal (which may be generated by a variable frequency oscillator (VFO) or XTAL frequency signal generator), counter 426 processes the loaded address and outputs data to decoder 428, which generates an enable for each word decoded for the address. The enable, when combined with clock signal 436, generates strobes 438 that direct the loading of the incoming aligned decoded data 432 into word registers 402-424. In some embodiments, some of the word registers 402-424 within page buffers 0 and 1 may not be loaded, which is determined by the address of the first word loaded into counter 426. Dual page buffer system 400 does not rely on a register because write enables (as described above in connection with FIGS. 1 and 2A) stop write accesses to undesired locations.

Figure 5:
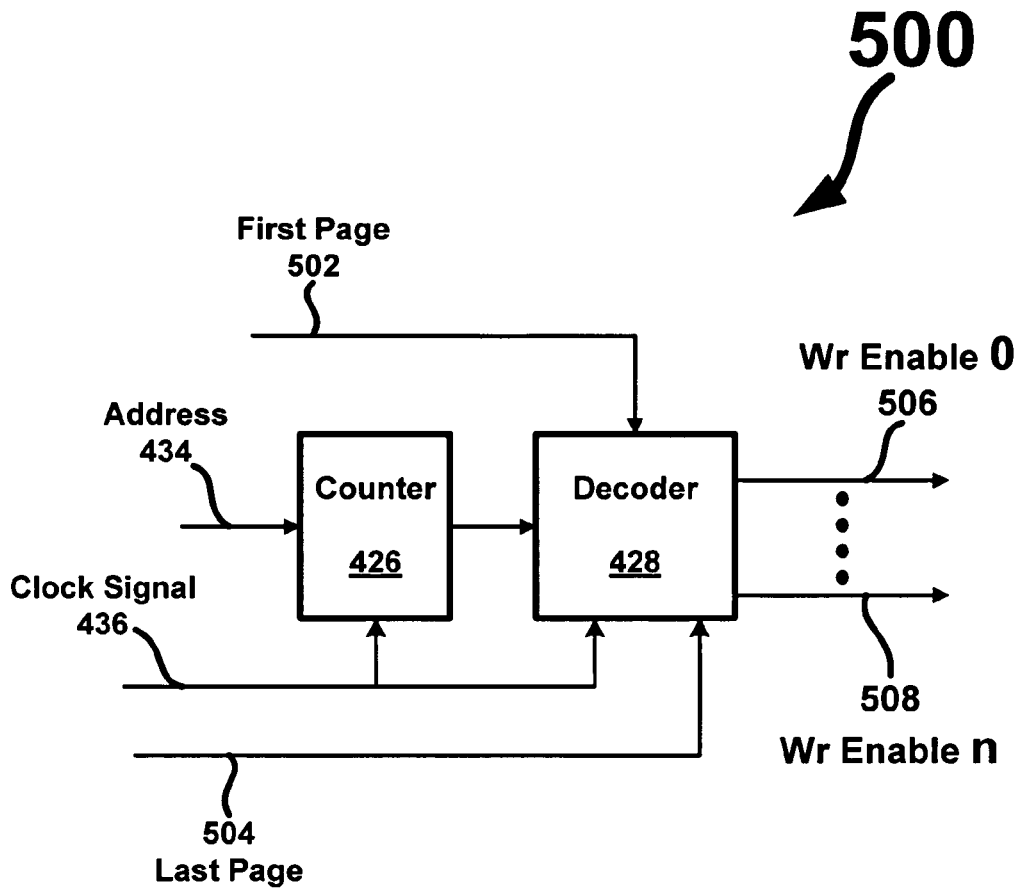
FIG. 5 illustrates a system configured to generate a write enable, in accordance with an embodiment.

FIG. 5 illustrates a system configured to generate at least one write enable, in accordance with an embodiment. Here, system 500 includes counter 426, decoder 428, address 434, clock signal 436, first page signal 502, last page signal 504, write enable signals Wr Enable 0 506, and Wr Enable n 508 are shown. Counter 426, decoder 428, address 434, and clock signal 436 may be implemented similar to those components shown in FIG. 4. System 500 may be used to generate write enables for each word or byte of decoded data received from aligner 106 (FIG. 1) into word registers 402-424 (FIG. 4). When a first page buffer (e.g., page buffer 0 or 1) has started to fill, a corresponding first address (i.e., an address indicating the location of where the data is to be written in memory array 102) is loaded into counter 426 and decoded and latched (e.g., stored) by decoder 428. In some embodiments, latching may refer to the correspondence of a write enable to page data output from a page buffer. The address pointed to (i.e., loaded into counter 426) and addresses that are hierarchically above it are enabled for the write access (i.e., write enabled). After the first page buffer is written to memory array 102 (i.e., when first page signal 502 is detected), write enables corresponding to the write access are activated. Write enabled addresses of memory array 102 remain active until last page signal 504 is received. When last page signal 504 is received, the loaded (i.e., counted) address(es) in counter 426 is input to decoder 428. Write enables are generated for address 434 and corresponding lower addresses, which are activated and made available for write access with page data from page buffers, as described above in connection with FIG. 4.

Figure 6A:
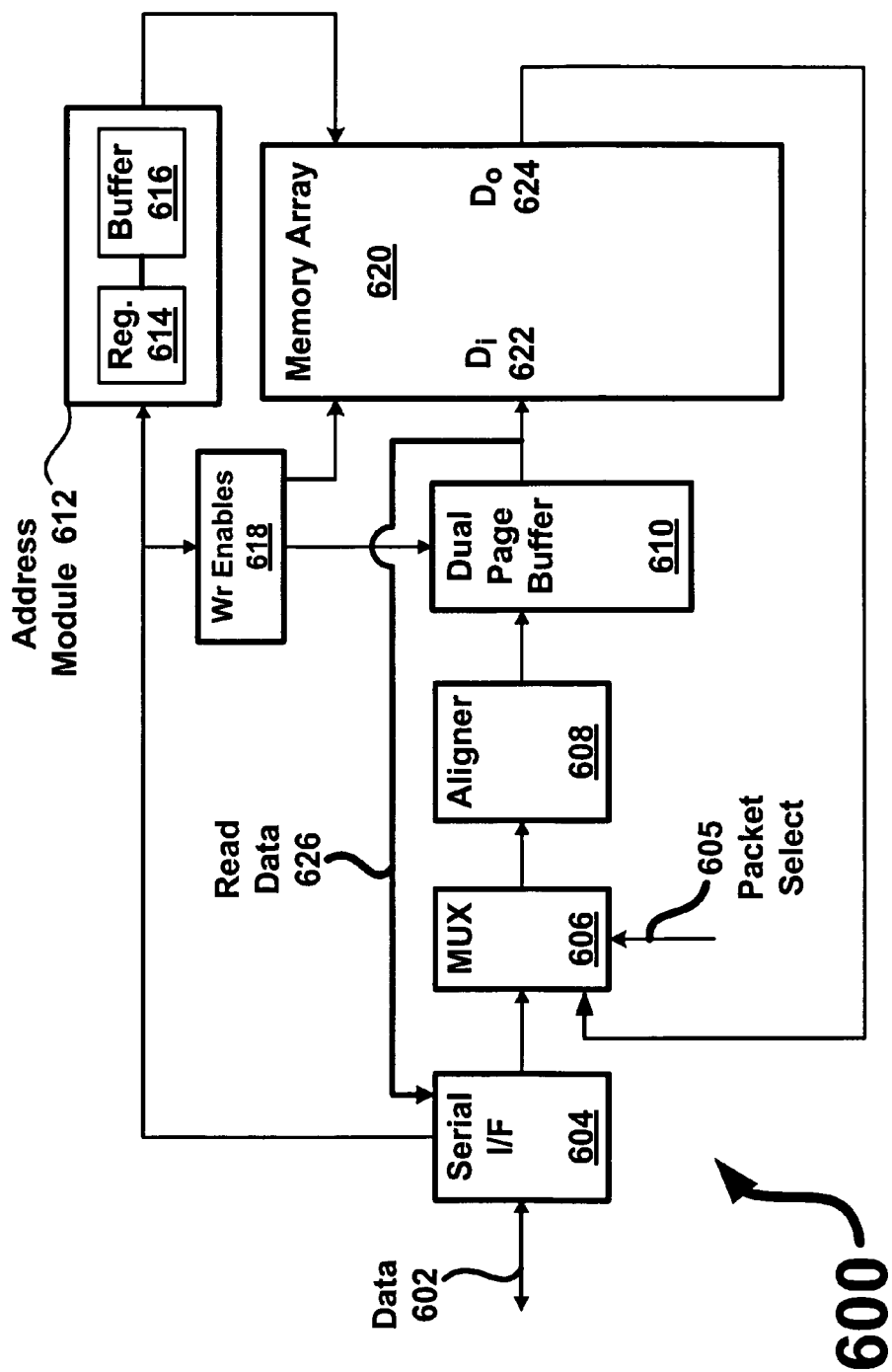
FIG. 6A illustrates an alternative exemplary memory system configured to perform fast block access, in accordance with an embodiment.

FIG. 6A illustrates an alternative exemplary memory system configured to perform fast block access, in accordance with an embodiment. Here, system 600 includes data 602, serial I/F 604, multiplexer (MUX) 606 (which multiplexes incoming data 602 from serial I/F 604 with output data $D_o$ 624 in response to a signal packet select 605), aligner 608, dual page buffer module 610, address module 612 which includes address register 614 and address buffer module 616, write enables module 618, memory array 620 (which receives input data $D_i$ 622 and generates output data $D_o$ 624), and read data 626. In some embodiments, system 600 may be configured to perform read and write accesses sequentially. The implementation shown includes read and write logic that share aligner 608 and dual page buffer module 610, enabling a read or write operation to be performed sequentially. However, system 600 may also be configured to support substantially simultaneous or simultaneous read and write accesses by implementing a duplicate of aligner 608 and dual page buffer module 610. In other embodiments, system 600 may be implemented differently and the above-described embodiment may be varied.

Figure 6B:
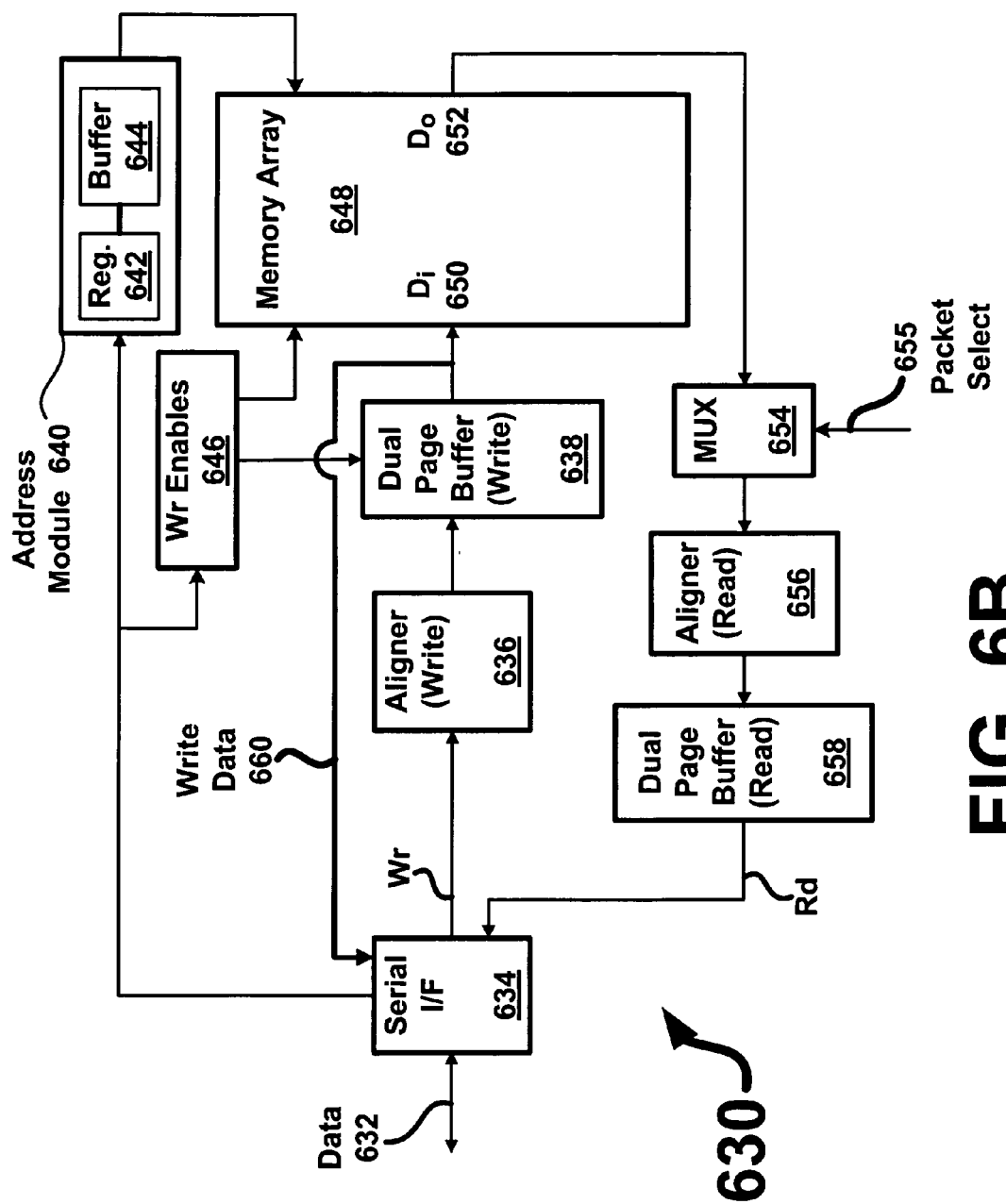
FIG. 6B illustrates an exemplary memory system configured to perform read and write accesses for fast block access, in accordance with an embodiment.

FIG. 6B illustrates an exemplary memory system configured to perform read and write accesses for fast block access, in accordance with an embodiment. Here, system 630 includes data 632, serial I/F 634, aligner (Write) 636, dual page buffer module (Write) 638, address module 640 (including address register 642 and address buffer 644), write enables module 646, memory array 648 (which receives input (Write) data $D_i$ 650 and generates output (Read) data $D_o$ 652) to MUX 654, aligner (Read) 656, and dual page buffer module (Read) 658), and write data 660 (which may be used to indicate when a page, word, or the like has been written to memory array 648 and the next page, word, or the like should be sent to aligner (Write) 636). In some embodiments, system 630 may be used to perform substantially simultaneous read and write accesses of data from and to memory array 648 because of the individual read (Rd) and write (Wr) paths, unlike the embodiment described above in connection with FIG. 6A.

Referring back to FIG. 6B, by using a duplicate data path for read and write operations, a write path (including aligner (Write) 636 and dual page buffer module (Write) 638)) and a read path (including MUX 654, aligner (Read) 656, dual page buffer module (Read) 658) may be implemented to read and write data at data transfer rates matching those of serial I/F 634. In other embodiments, more, fewer, or different components may be used instead of those shown and described above.

In other embodiments, read and write accesses may be performed using system 600 (FIG. 6A). By using separate read (Rd) and write (Wr) paths, each of which has an assigned aligner and page buffer, substantially-simultaneous operations may be performed. Here, data 602 is transferred over serial I/F 604. Data to be written is passed to MUX 606, which in response to a signal packet select 605, multiplexes output data $D_o$ 624 with incoming data 602 (which has been decoded by serial I/F 604). Once multiplexed, aligner 608 aligns data (as described above in connection with FIG. 3A) and passes the aligned, decoded data to dual page buffer module 610. If a write access is performed, aligned, decoded data is loaded into dual page buffer module 610 and transferred to memory array 620 as input data $D_i$ 622. However, if a read access is performed, data to be read is transferred as output data $D_o$ 624 to multiplexer 606, aligner 608, and dual page buffer module 610, which shifts read data 626 to serial I/F 604 for transfer to the requesting host. The above-described elements and techniques are not limited to the descriptions provided and, in other embodiments, may be implemented differently.

Figure 7A:
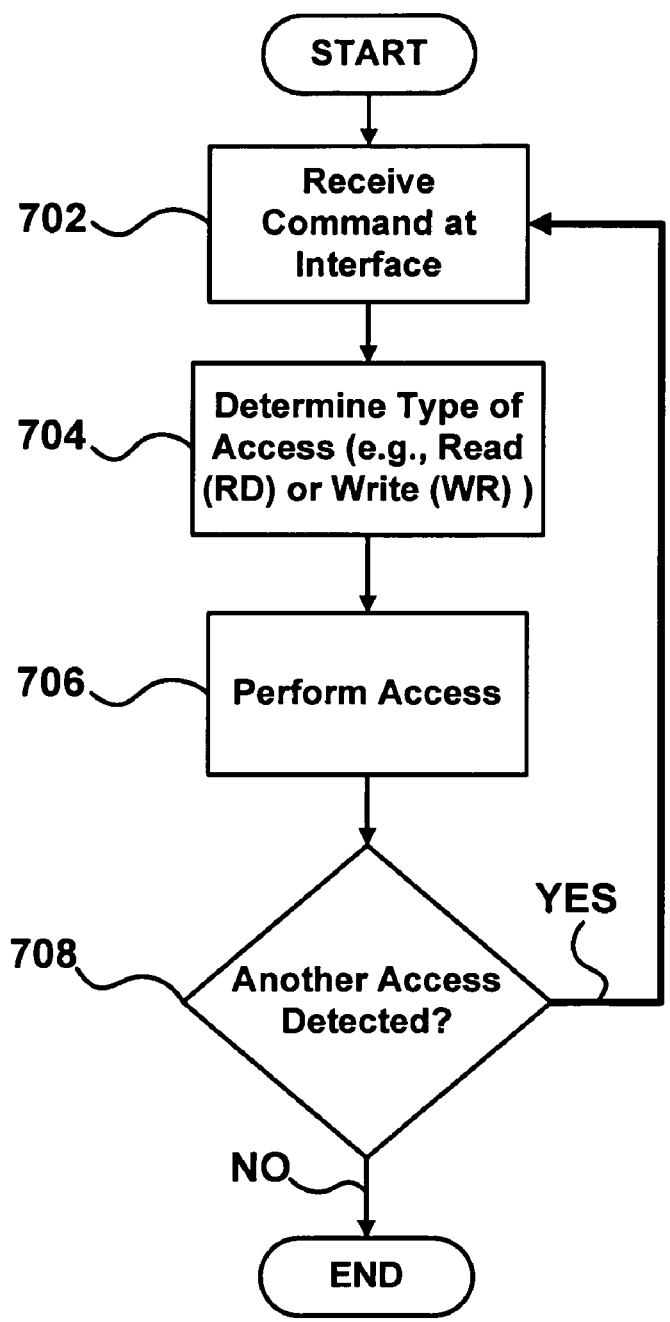
FIG. 7A illustrates an exemplary process for accessing a memory, in accordance with an embodiment.
Figure 7B:
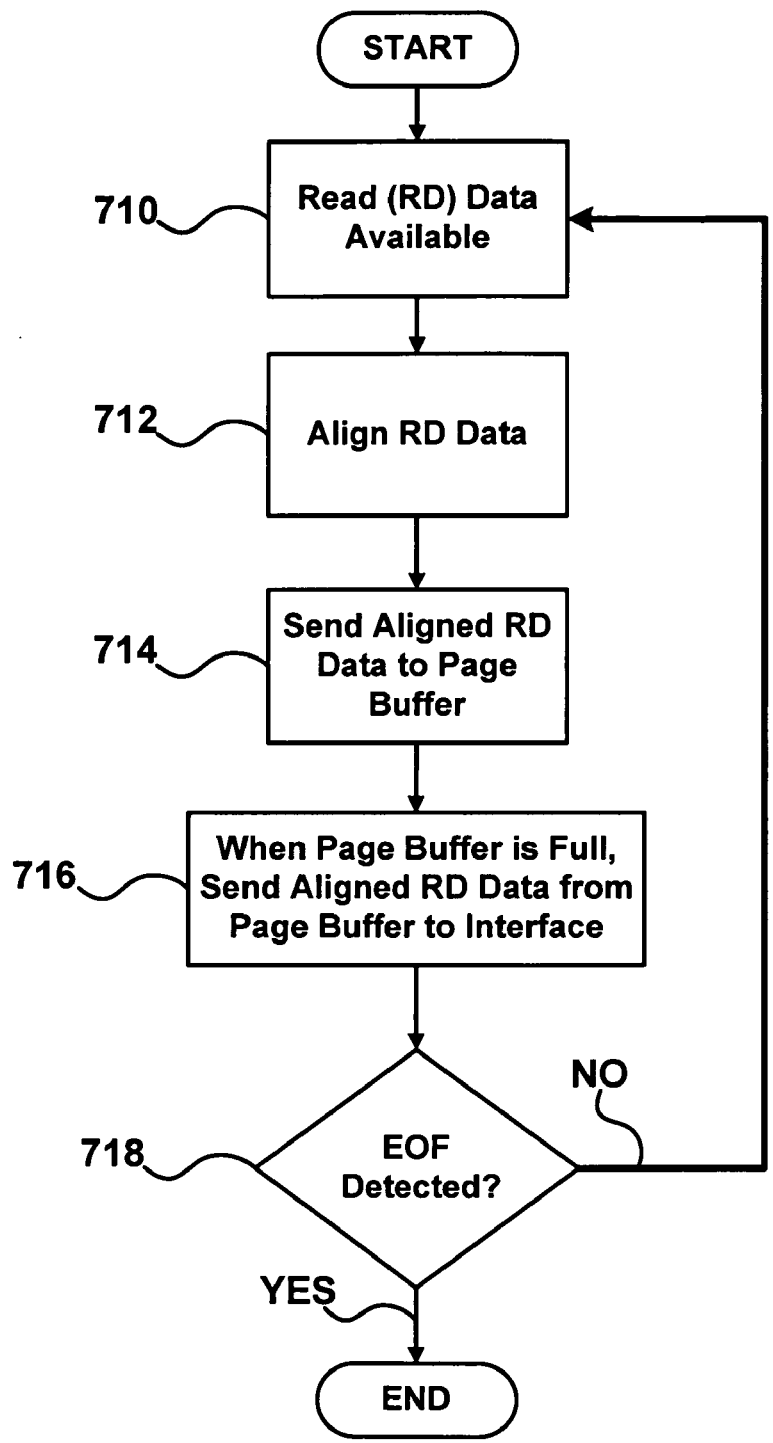
FIG. 7B illustrates an exemplary process for reading data from a memory, in accordance with an embodiment.
Figure 7C:
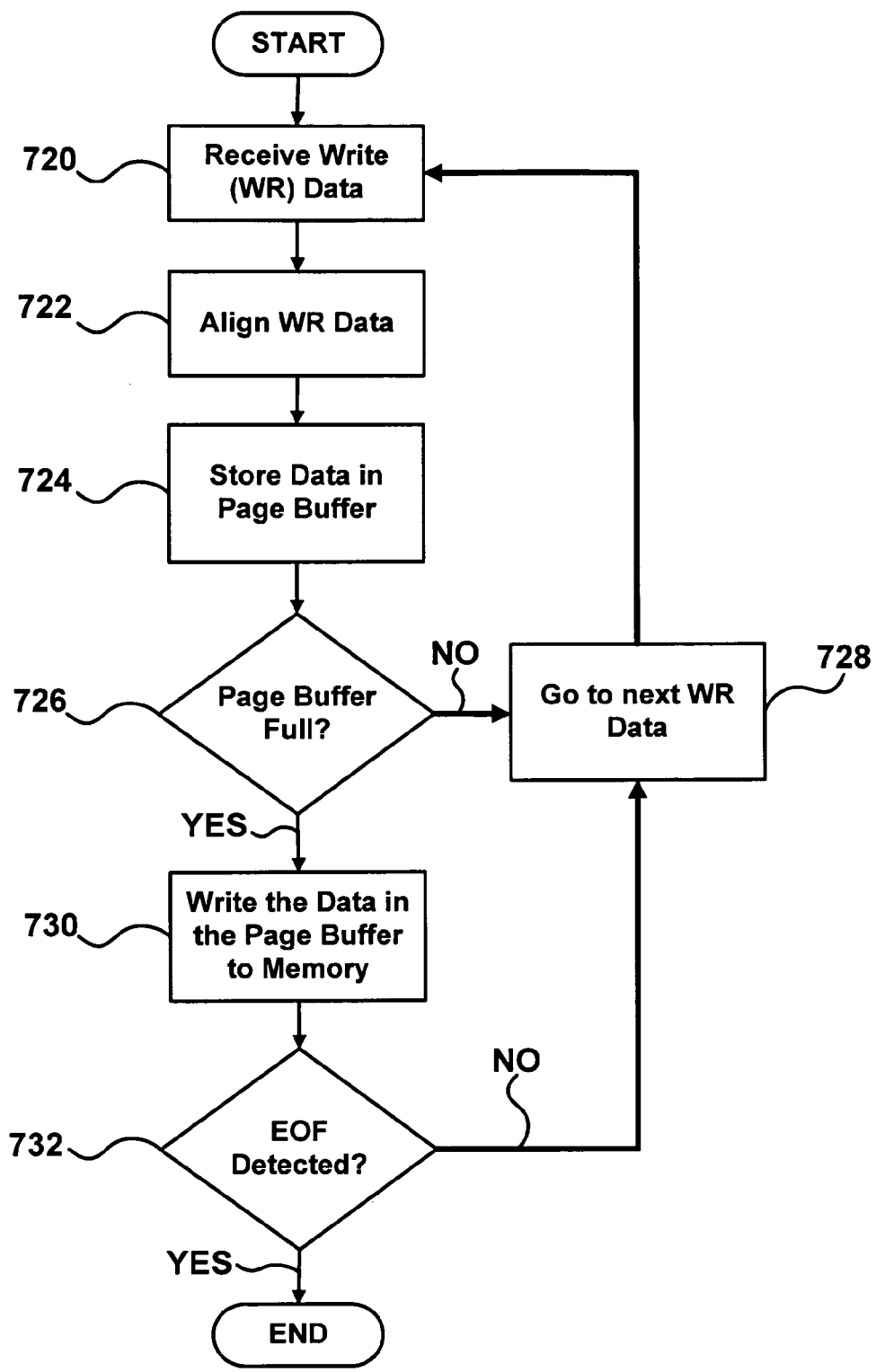
FIG. 7C illustrates an exemplary process for writing data to a memory, in accordance with an embodiment.

FIG. 7A illustrates an exemplary process for accessing a memory for data operations (e.g., read or write), in accordance with an embodiment. In some embodiments, at a stage 702, an access command is received at an interface (e.g., serial, multiple serial, parallel, HSSI, and the like). An access command may include data or signals that indicate or initiate a data operation (e.g., a read or write access). When an access is detected, the type of access is determined at a stage 704. Once determined, the access is performed at a stage 706. After completing the access operation (e.g., read, write), then at a stage 708, a determination is made as to whether another access is requested (i.e. detected). If another access is not detected, then a "NO" branch is taken and the memory access ends. On the other hand, if another access is detected, then a "YES" branch is taken and the process repeats at the stage 702. In some embodiments, multiple read and write accesses may be requested and, if detected, the accesses may be performed at the data transfer/communication rates of interfaces such as those described above. In some embodiments, at the stage 708, if another access is detected, then the "YES" branch is taken and the process repeats at the stage 704 to determine the type of access being requested (e.g., a read or a write access). FIGS. 7B and 7C describe read and write accesses, respectively, that may be performed for the stage 706 described above.

FIG. 7B illustrates an exemplary process for reading data from a memory, in accordance with an embodiment. Here, a read (RD) access may be performed, as initially described above in step 706 (FIG. 7A). At a stage 710, If a read access is detected (i.e., read data is made available), then a read access is initiated. If RD data is available in a memory, then the RD data is retrieved from memory and aligned at a stage 712. At a stage 714, the aligned RD data is sent to a page buffer, which will be used to store data in blocks that can be transferred across an interface without reducing data transfer rates. Once the page buffer is full of aligned RD data, a transfer is performed at a stage 716, sending the aligned RD data to an interface for transfer to the requesting host, memory, client, application, or the like. After the transfer of the aligned RD data from a full page buffer, at a stage 718 a determination is made as to whether an end of frame (EOF) bit or primitive is detected. If an EOF is detected, then a "YES" branch is taken and the read access ends. If an EOF is not detected, then a "NO" branch is taken and the process repeats (i.e., at the stage 710) until the requested data is completely read from memory and sent to the requesting host, memory, client, application, or the like.

FIG. 7C illustrates an exemplary process for writing data to a memory, in accordance with an embodiment. Here, a write (WR) access may be performed, as initially described above in step 706 (FIG. 7A). In some embodiments, at a stage 720, a write access may be performed by receiving WR data to be written to memory at an interface, such as those described above. Once received, at a stage 722, the WR data is aligned for storage in a page buffer. After alignment, at a stage 724, the WR data to be written to memory is transferred to the page buffer. The page buffer may be implemented using various sizes and capacities (e.g., 4-word) and is not limited to the embodiments described above. At a stage 726, a determination is made as to whether the page buffer is full. If the page buffer is not full, then a "NO" branch is taken and at a stage 728, the next WR data packet, segment, frame, block or the like, is retrieved at the interface, aligned, and stored in the page buffer. If the page buffer is full, then a "YES" branch is taken and at a stage 730, the data stored in the page buffer is transferred and written to memory. Once written, at a stage 732, a determination is made as to whether the data written from the page buffer included an end of frame (EOF) bit or primitive. If an EOF bit or primitive was detected, then a "YES" branch is taken and the process ends. If not, then a "NO" branch is taken and the process continues at the stage 728 for the next packet, segment, frame, block, or other section of write data to be written to memory. In other embodiments, the above-described processes may be varied and are not limited to the descriptions provided.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for data operations in a system, comprising:
providing at least one substrate including circuitry fabricated on the substrate and at least one non-volatile two-terminal cross-point memory array that is in contact with the substrate, is positioned over the circuitry, and is electrically coupled with the circuitry, and at least a portion of the circuitry configured to perform data access operations on the at least one non-volatile two-terminal cross-point memory array;

receiving data at an interface that is electrically coupled with the circuitry, the data including a data packet having a plurality of formatted data fields, the plurality of formatted data fields including one or more data fields selected from the group consisting of an end of frame (EOF) data field, a cyclic redundancy check (CRC) data field, a synchronization (Sync) data field, an address data field, a read (Rd) data field, a read/write (Rd/Wr) data field, a transfer count data field, and an alignment (Align) data field;

aligning a bit alignment of the data based on data included in one or more of the plurality of formatted data fields to generate aligned data;

storing the aligned data in a page buffer module, the page buffer module being configured to store the aligned data for a write access to the at least one non-volatile two-terminal cross-point memory array and to store retrieved data from a read access to the at least one non-volatile two-terminal cross-point memory array;

writing the aligned data to the at least one non-volatile two-terminal cross-point memory array; and transferring the retrieved data from the read access to the interface.

2. The method as set forth in claim 1, wherein writing the aligned data to the at least one non-volatile two-terminal cross-point memory array and transferring the retrieved data to the interface are performed simultaneously.

3. The method as set forth in claim 2, wherein writing the aligned data to the at least one non-volatile two-terminal cross-point memory array further comprises generating at least one write enable to activate at least one address in the at least one non-volatile two-terminal cross-point memory array for the write access.

4. The method as set forth in claim 3, wherein the at least one write enable is operative to enable bytes or words within the address to be written selectively in parallel.

5. The method as set forth in claim 1, wherein the receiving the data at the interface occurs at a first rate and writing the aligned data to the at least one non-volatile two-terminal cross-point memory array occurs at the first rate.

6. The method as set forth in claim 5, wherein transferring the retrieved data to the interface occurs at the first rate.

7. The method as set forth in claim 1, wherein the at least one non-volatile two-terminal cross-point memory array comprises a stacked two-terminal cross-point memory array.

8. A method for data operations in a system, comprising:
providing at least one substrate including circuitry fabricated on the substrate and at least one non-volatile two-terminal cross-point memory array that is in contact with the substrate, is positioned over the circuitry, and is electrically coupled with the circuitry, and at least a portion of the circuitry configured to perform data access operations on the at least one non-volatile two-terminal cross-point memory array;

receiving an access command at an interface that is electrically coupled with the circuitry, the access command including data or signals operative to initiate the data access operations on the at least one non-volatile two-terminal cross-point memory array, the access command comprises a data packet including a plurality of formatted data fields, the plurality of formatted data fields including one or more data fields selected from the group consisting of an end of frame (EOF) data field, a cyclic redundancy check (CRC) data field, a synchronization (Sync) data field, an address data field, a read (Rd) data field, a read/write (Rd/Wr) data field, a transfer count data field, and an alignment (Align) data field;

determining an access type from the access command based on data included in one or more of the plurality of formatted data fields; and performing the data access operations on the at least one non-volatile two-terminal cross-point memory array based on the access type.

9. The method as set forth in claim 8 and further comprising: repeating the receiving, the determining, and the performing when another access command is detected by the interface.

10. The method as set forth in claim 8, wherein the at least one non-volatile two-terminal cross-point memory array comprises a stacked two-terminal cross-point memory array.

11. A method for read data operations in a system, comprising:
providing at least one substrate including circuitry fabricated on the substrate and at least one non-volatile two-terminal cross-point memory array that is in contact with the substrate, is positioned over the circuitry, and is electrically coupled with the circuitry, and at least a portion of the circuitry configured to perform data access operations on the at least one non-volatile two-terminal cross-point memory array;

detecting a read access in an access command received at an interface that is electrically coupled with the circuitry, the circuitry configured to do the detecting, the access command comprises a data packet including a plurality of formatted data fields, the plurality of formatted data fields including one or more data fields selected from the group consisting of an end of frame (EOF) data field, a cyclic redundancy check (CRC) data field, a synchronization (Sync) data field, an address data field, a read (Rd) data field, a read/write (Rd/Wr) data field, a transfer count data field, and an alignment (Align) data field, wherein the read access is determined based on data included in one or more of the plurality of formatted data fields;

(a) retrieving read data from the at least one non-volatile two-terminal cross-point memory array, the circuitry configured to do the retrieving;

(b) aligning the read data to generate aligned data, the circuitry configured to do the aligning;

(c) sending the aligned data to a page buffer, the circuitry configured to do the sending;

(d) sending the aligned data in the page buffer to the interface when the page buffer is full, the circuitry configured to do the sending; and repeating (a), (b), (c), and (d) in that order, until an end of frame (EOF) is detected in the access command.

12. The method as set forth in claim 11, wherein the at least one non-volatile two-terminal cross-point memory array comprises a stacked two-terminal cross-point memory array.

13. A method for write data operations in a system, comprising:
providing at least one substrate including circuitry fabricated on the substrate and at least one non-volatile two-terminal cross-point memory array that is in contact with the substrate, is positioned over the circuitry, and is electrically coupled with the circuitry, and at least a portion of the circuitry configured to perform data access operations on the at least one non-volatile two-terminal cross-point memory array;

detecting a write access in an access command received at an interface that is electrically coupled with the circuitry, the circuitry configured to do the detecting;
(a) receiving write data from the interface, the circuitry configured to do the receiving;
(b) aligning the write data to generate aligned data, the circuitry configured to do the aligning;
(c) storing the aligned data in a page buffer, the circuitry configured to do the storing; and
(d) writing the aligned data from the page buffer to the at least one non-volatile two-terminal cross-point memory array when the page buffer is full, the circuitry configured to do the writing.

14. The method as set forth in claim 13, wherein the at least one non-volatile two-terminal cross-point memory array comprises a stacked two-terminal cross-point memory array.

15. The method as set forth in claim 13, wherein the access command comprises a data packet including a plurality of formatted data fields.

16. The method as set forth in claim 15, wherein the plurality of formatted data fields includes one or more data fields selected from the group consisting of an end of frame (EOF) data field, a cyclic redundancy check (CRC) data field, a synchronization (Sync) data field, an address data field, a read (Rd) data field, a read/write (Rd/Wr) data field, a transfer count data field, and an alignment (Align) data field.

17. The method as set forth in claim 13 and further comprising:
repeating (a), (b), (c) in that order, until the page buffer is full.

18. The method as set forth in claim 13 and further comprising:
repeating (a), (b), (c), and (d) in that order, until an end of frame (EOF) is detected in the access command.

* * * * *